(12) United States Patent
Chung et al.

(10) Patent No.: US 11,069,757 B2
(45) Date of Patent: Jul. 20, 2021

(54) ORGANIC LIGHT EMITTING DIODE DISPLAY PANEL AND METHOD FOR MAKING SAME

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventors: Chin-Feng Chung, Zhunan (TW); Hsien-Wei Chiang, Zhunan (TW)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

( * ) Notice: Subject to any disclaimer, the term of this patent is extended or adjusted under 35 U.S.C. 154(b) by 33 days.

(21) Appl. No.: 16/502,133

(22) Filed: Jul. 3, 2019

(65) Prior Publication Data
US 2020/0303473 A1    Sep. 24, 2020

(30) Foreign Application Priority Data
Mar. 20, 2019  (CN) .......................... 201910213025.2

(51) Int. Cl.
*H01L 27/32*    (2006.01)
*G02F 1/163*    (2006.01)
(Continued)

(52) U.S. Cl.
CPC .......... *H01L 27/3232* (2013.01); *G02F 1/155* (2013.01); *G02F 1/157* (2013.01);
(Continued)

(58) Field of Classification Search
CPC . G02F 1/15; G02F 1/157; G02F 1/163; G02F 1/155; H01L 27/3232; H01L 51/5209; H01L 51/56
See application file for complete search history.

(56) References Cited

U.S. PATENT DOCUMENTS

2006/0170665 A1*  8/2006  Morita ..................... G02F 1/157
                                                             345/204
2007/0069995 A1*  3/2007  Shin ..................... H01L 27/3244
                                                             345/76
(Continued)

FOREIGN PATENT DOCUMENTS

WO    WO2015155925    * 10/2015

*Primary Examiner* — Bilkis Jahan
*Assistant Examiner* — Victor V Barzykin
(74) *Attorney, Agent, or Firm* — ScienBiziP, P.C.

(57) ABSTRACT

An OLED display panel providing color compensation without overdriving light emitting units includes the light emitting units and a substrate. Each light emitting unit includes a light emitting element and an electrochromic element. The light emitting element is on a side of the electrochromic element away from the substrate. The electrochromic element includes first anode and cathode, and an electrochromic layer between them. The light emitting element includes second anode and cathode, and light emitting material between them. A portion of the second anode is shared with the first cathode. The present disclosure also provides a method for making such OLED display panel. The OLED display panel uses the electrochromic elements for color compensation, reducing the energy consumption of the display panel and prolonging service life.

8 Claims, 8 Drawing Sheets

(51) Int. Cl.
*G02F 1/157* (2006.01)
*H01L 51/52* (2006.01)
*H01L 51/56* (2006.01)
*G02F 1/155* (2006.01)

(52) U.S. Cl.
CPC .......... *G02F 1/163* (2013.01); *H01L 51/5209* (2013.01); *H01L 51/56* (2013.01); *G02F 2001/1635* (2013.01); *G02F 2201/44* (2013.01); *H01L 27/3244* (2013.01)

(56) References Cited

U.S. PATENT DOCUMENTS

| | | | |
|---|---|---|---|
| 2007/0138941 A1* | 6/2007 | Jin | H01L 27/3232 313/503 |
| 2015/0255519 A1* | 9/2015 | Lee | H01L 51/5271 345/207 |
| 2016/0266459 A1* | 9/2016 | Oh | G02F 1/153 |
| 2018/0286930 A1* | 10/2018 | Gai | G02B 27/0172 |
| 2019/0187530 A1* | 6/2019 | Liu | G02B 5/285 |
| 2020/0017648 A1* | 1/2020 | Agrawal | C03C 17/23 |
| 2020/0319521 A1* | 10/2020 | Qin | G02F 1/29 |

* cited by examiner

ORGANIC LIGHT EMITTING DIODE DISPLAY PANEL AND METHOD FOR MAKING SAME

FIELD

The subject matter herein generally relates to organic light emitting diode display panels and a method for making the same.

BACKGROUND

Organic light emitting diode (OLED) display panels are widely used in digital products because of the light weight, low power consumption, and other characteristics. OLED display technology is different from the traditional liquid crystal display (LCD) in display mode. No backlight is needed. Very thin organic light emitting material layer and glass substrate are used. When current passes through the organic light emitting material layer, the organic light emitting material layer emits light. However, due to the characteristics of organic light emitting materials, organic light emitting materials may easily deteriorate during use, especially under high power.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
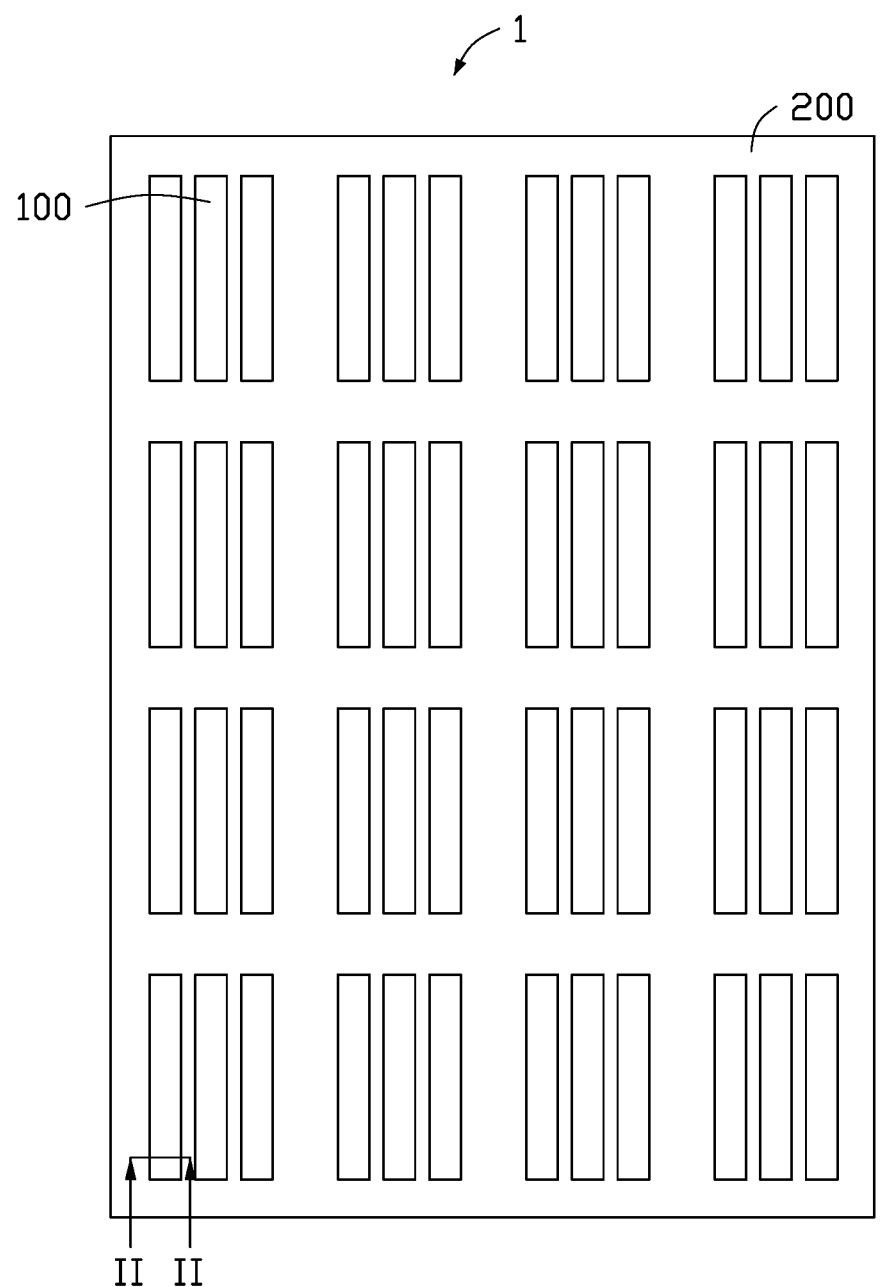
FIG. 1 is a plan view of an OLED display panel according to a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

Referring to FIG. 1, the OLED display panel 1 includes a substrate 200 and a plurality of light emitting units 100 on the substrate 200. In this embodiment, three adjacent light emitting units 100 form a group, and the three light emitting units 100 in the group respectively emit red light, blue light, and green light. In other embodiments, the number of light emitting cells 100 in each group is not limited. In one embodiment, each group may further include a light emitting unit 100 that emits white light. In one embodiment, the substrate 200 is a thin film transistor (TFT) array substrate.

Figure 2:
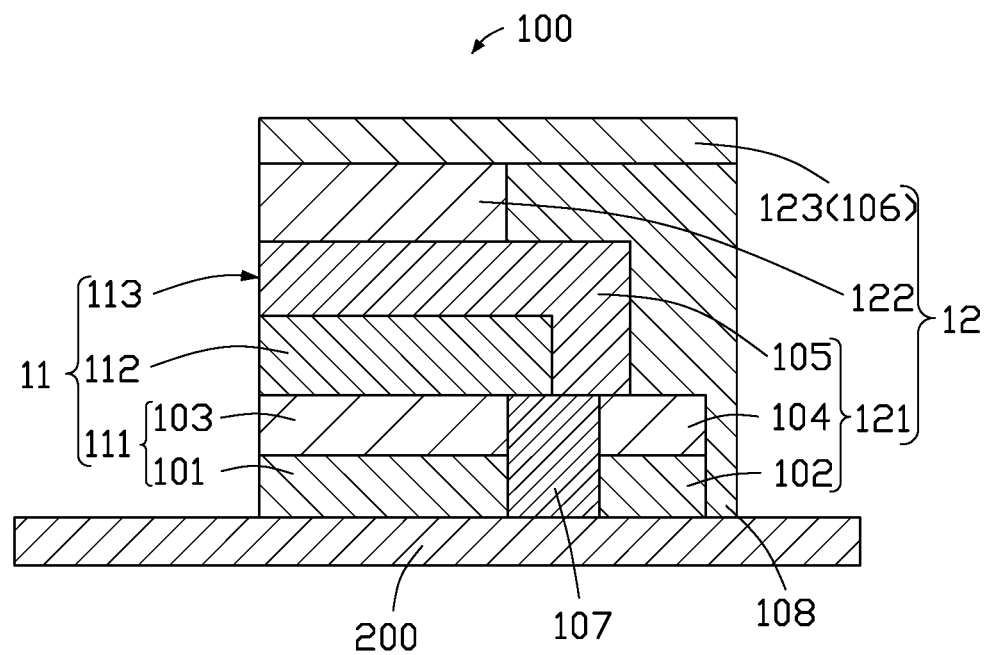
FIG. 2 is a cross-sectional view along line II-II of FIG. 1.

Referring to FIG. 2, a cross-sectional view taken along line II-II of FIG. 1 is shown. Each light emitting unit 100 includes a light emitting element 12 on the substrate 200 and an electrochromic element 11 on the substrate 200. The electrochromic element 11 provides color compensation of the light emitting unit 100.

As shown in FIG. 2, the electrochromic element 11 includes a first anode 111, a first cathode 113, and an electrochromic layer 112 between the first anode 111 and the first cathode 113. The first anode 111 includes a first metallic oxide layer 101 on the substrate 200 and a first metal layer 103 on a surface of the first metallic oxide layer 101 away from the substrate 200. The electrochromic layer 112 is on a surface of the first metal layer 103 away from the substrate 200. The first cathode 113 includes a metallic oxide layer 105 that covers the electrochromic layer 112. The electrochromic element 11 is effectively a capacitive structure, and the electrochromic layer 112 performs oxidation-reduction electrochemical reaction driven by the first anode 111 and the first cathode 113. The electrochemical reaction changes its reflectivity and transparency, thereby realizing color compensation for the light emitting element 12.

Different oxidation states and reduction states of the electrochromic layer 112 correspond to different colors. A material of the electrochromic layer 112 may be selected from tungsten trioxide ($WO_3$, transparent in oxidation state and dark blue in reduction state), molybdenum trioxide ($MoO_3$, transparent in oxidation state and dark blue in reduction state), titanium dioxide ($TiO_2$, transparent in oxidation state and light blue in reduction state), cerium oxide ($IrO_2$, black in oxidation state and transparent in reduction state), cobalt oxide (CoO, red in oxidation state and blue in reduction state), antimony trioxide ($Rh_2O_3$, yellow in oxidation state and green in reduction state), nickel oxide (NiO, dark copper in oxidation state and transparent in reduction state), and so on.

The material of the electrochromic layer 112 may be selected according to the desired colors of the light emitted from the light emitting element 12. For example, when the light emitting unit 100 is to emit blue light, the material of the electrochromic layer 112 may be molybdenum trioxide. In order to increase the intensity of the blue light, the electrochromic layer 112 may be driven to a reduction state. When light from the light emitting element 12 falls on the electrochromic layer 112, the electrochromic layer 112 absorbs light of wavelengths other than dark blue, the dark blue light is reflected.

It can be understood that when the light emitting unit 100 is to emit red light or green light, other suitable materials (i.e., materials with corresponding colors in reduced or oxidized states) can be selected as the material of the electrochromic layer 112 to compensate for these colors. The OLED display panel 1 includes at least one electrochromic layer 112. In this embodiment, the OLED display panel 1 includes electrochromic layers 112 corresponding to light emitting units 100 emitting light of different colors.

As shown in FIG. 2, the first metallic oxide layer 101 in the first anode 111 can better adhere to the substrate 200 containing oxide, and the first metal layer 103 in the first anode 111 can increase the conductivity of the first anode 111. In addition, the first metal layer 103 also serves as a reflective layer to reflect light incident on its surface to a side of the first metal layer 103 away from the substrate 200.

In one embodiment, the light emitting element 12 is an organic light emitting diode (OLED). As shown in FIG. 2, the light emitting element 12 includes a second anode 121, a second cathode 123, and a light emitting material 122 between the second anode 121 and a second electrode 123. A portion of the first cathode 113 of the electrochromic element 11 is shared with the second anode 121 of the light emitting element 12. Thus the first cathode 113 forms a portion of the second anode 121, so that when manufacturing the OLED display panel 1, it is not necessary to separately manufacture the second anode 121 and the first cathode 113, thereby saving the manufacturing cost and simplifying the manufacturing process.

In this embodiment, the second anode 121 includes a second metallic oxide layer 102, a metallic oxide layer 105, and a second metal layer 104 between the second metallic oxide layer 102 and the metallic oxide layer 105. The second metal layer 104 electrically connects the second metallic oxide layer 102 and the metallic oxide layer 105. The metallic oxide layer 105 in the first anode 121 also functions as the first cathode 113 of the electrochromic element 11. The second cathode 123 includes a third metal layer 106, and the third metal layer 106 allows light to pass through.

When the light emitting element 12 emits light, a portion of the light is emitted in a direction away from the substrate 200 to form a first light. A portion of the light is emitted toward the substrate 200 to form a second light. After compensation is applied by the electrochromic layer 112, the intensity of the second light is increased, and it is reflected by the first metal layer 103 toward the direction away from the substrate 200. Therefore, while not affecting the display, the light emitting capacity of the light emitting element 12 can be reduced, to prolong the service life of the light emitting material 122 and reduce the energy consumption of the OLED display panel 1.

The first metallic oxide layer 101 and the second metallic oxide layer 102 are made of the same material. The first metal layer 103 and the second metal layer 104 are made of the same material. The first metallic oxide layer 101 and the second metallic oxide layer 102 are insulated and spaced apart from each other by a first insulating layer 107. The first metal layer 103 and the second metal layer 104 are insulated and spaced apart from each other by the first insulating layer 107.

In one embodiment, the surface of the first insulating layer 107 away from the substrate 200 is flush with the surfaces of the first metal layer 103 and the second metal layer 104 away from the substrate 200, which is favorable for the fabrication of subsequent components.

As shown in FIG. 2, the electrochromic layer 112 completely covers the first metal layer 103, partially covers the first insulating layer 107, and does not cover the second metal layer 104. The metallic oxide layer 105 extends from the surface of the electrochromic layer 112 away from the first anode 111 to the second metal layer 104 along one side surface of the electrochromic layer 112, and is electrically connected with the second metal layer 104, so that the metallic oxide layer 105 is electrically connected with the second metal layer 104 and the second metallic oxide layer 102 together as the second anode 121.

The second metallic oxide layer 102 in the second anode 121 can be better attached to the substrate 200 in containing oxide, the second metal layer 104 in the second anode 121 can increase the conductivity of the second anode 121, and the metallic oxide layer 105 facilitates the injecting of holes into the light emitting material 122.

As shown in FIG. 2, a projection of the light emitting material 122 on the substrate 200 at least partially overlaps with a projection of each of the metallic oxide layer 105, the electrochromic layer 112, the first metal layer 103, and the first metallic oxide layer 101 on the substrate 200. The projection of the light emitting material 122 on the substrate 200 does not overlap with the projection of the second metal layer 104 on the substrate 200 and the projection of the second metallic oxide layer 102 on the substrate 200. In one embodiment, the projection of the light emitting material 122 on the substrate 200 is completely covered by the projection of the electrochromic layer 112 on the substrate 200, and is also completely covered by the projection of the first metal layer 103 on the substrate 200. That is, the projection of the light emitting material 122 on the substrate 200 completely overlaps with the projection of the electrochromic layer 112 on the substrate 200 and completely overlaps with the projection of the first metal layer 103 on the substrate 200. An area of the projection of the light emitting material 122 on the substrate 200 is larger than an area of the projection of the electrochromic layer 112 on the substrate 200 and an area of the projection of the first metal layer 103 on the substrate 200. Thereby, the light emitted by the luminescent element 12 toward the electrochromic element 11 can be totally emitted to the electrochromic element 11 and reflected by the first metal layer 103, thereby effectively improving the utilization of light.

The light emitting material 122 covers at least part of the metallic oxide layer 105, and differences in segmentation between the light emitting material 122 and other elements can be filled up through the second insulating layer 108, which also serves as a protective layer.

In one embodiment, the second insulating layer 108 covers the metallic oxide layer 105, the second metal layer 104, and the second metallic oxide layer 102. The surface of the second insulating layer 108 away from the substrate 200 is flush with the surface of the light emitting material 122 away from the substrate 200, thus facilitating the fabrication of subsequent components.

Figure 3:
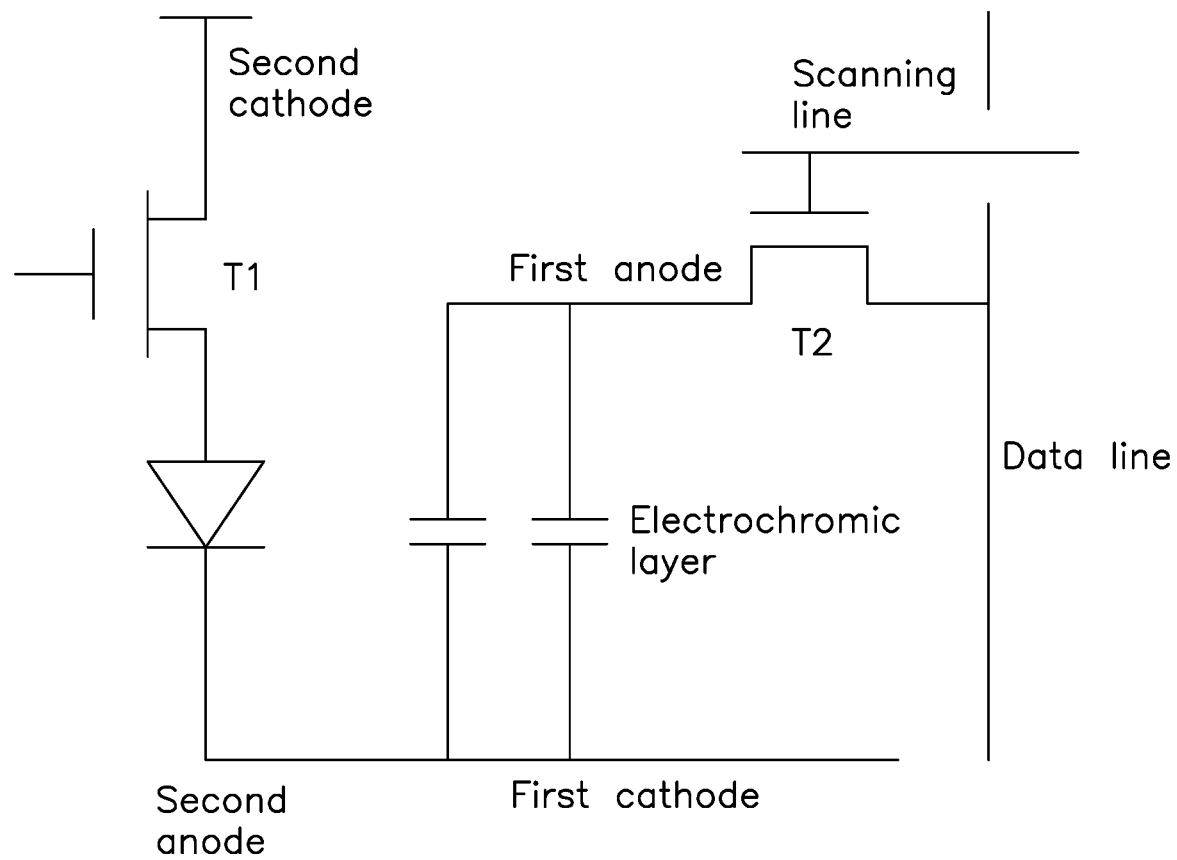
FIG. 3 is an equivalent circuit diagram of a light emitting unit according to the first embodiment.

Referring to FIG. 3, an equivalent circuit diagram of the light emitting unit 100 according to the first embodiment is shown. Only one driving thin film transistor (first thin film transistor) T1 is shown in the circuit of the light emitting element 12. It is understood that the light emitting element 12 further includes other thin film transistors, such as switching transistors and the like. The electrochromic element 11 can be controlled by a second thin film transistor T2, and the anode of the light emitting element 12 is shared with the cathode of the electrochromic element 11. In this embodiment, scanning lines and data lines connected to the second thin film transistor T2 are different from the scanning lines and the data lines controlling the light emitting element 12. The OLED display panel 1 controls the electrochromic element 11 and the light emitting element 12 using different circuits. The OLED display panel 1 adjusts the brightness of the light emitting element 12 and the color of the electrochromic element 11 according to display requirements. When the electrochromic element 11 is used for color compensation of the light emitting element 12, the power of the light emitting element 12 can be reduced to save electricity.

In one embodiment, the first metallic oxide layer 101, the second metallic oxide layer 102, and the metallic oxide layer 105 may be made of indium tin oxide (ITO). The first metal layer 103, the second metal layer 104 and the third metal layer 106 may be made of silver (Ag).

In the following embodiments, elements having the same or similar structures and functions as those of the first embodiment are denoted by the same reference numerals.

Figure 4:
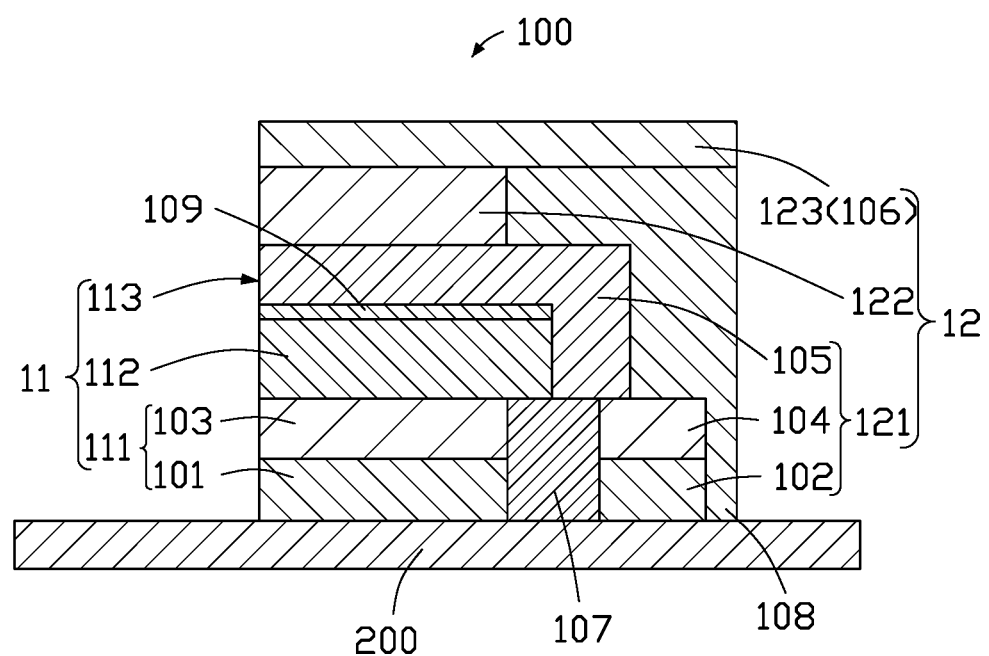
FIG. 4 is a cross-sectional view of a light emitting unit according to a second embodiment of the present disclosure.

Referring to FIG. 4, a cross-sectional view of a light emitting unit 100 according to a second embodiment of the present disclosure is shown. The structure of the light emitting unit 100 of the second embodiment differs from the light emitting unit 100 of the first embodiment in that, in the second embodiment, a fourth metal layer 109 is further included between the metallic oxide layer 105 and the electrochromic layer 112. The fourth metal layer 109 is in direct contact with and electrically connected to the metallic oxide layer 105, which increases the conductivity of the first cathode 113 or the second anode 121. The fourth metal layer 109 completely covers the electrochromic layer 112, the thickness of the fourth metal layer 109 is less than the thicknesses of the first and second metal layers 103 and 104, and the fourth metal layer 109 is capable of transmitting light and allowing light to pass through without substantially affecting the display.

Figure 5:
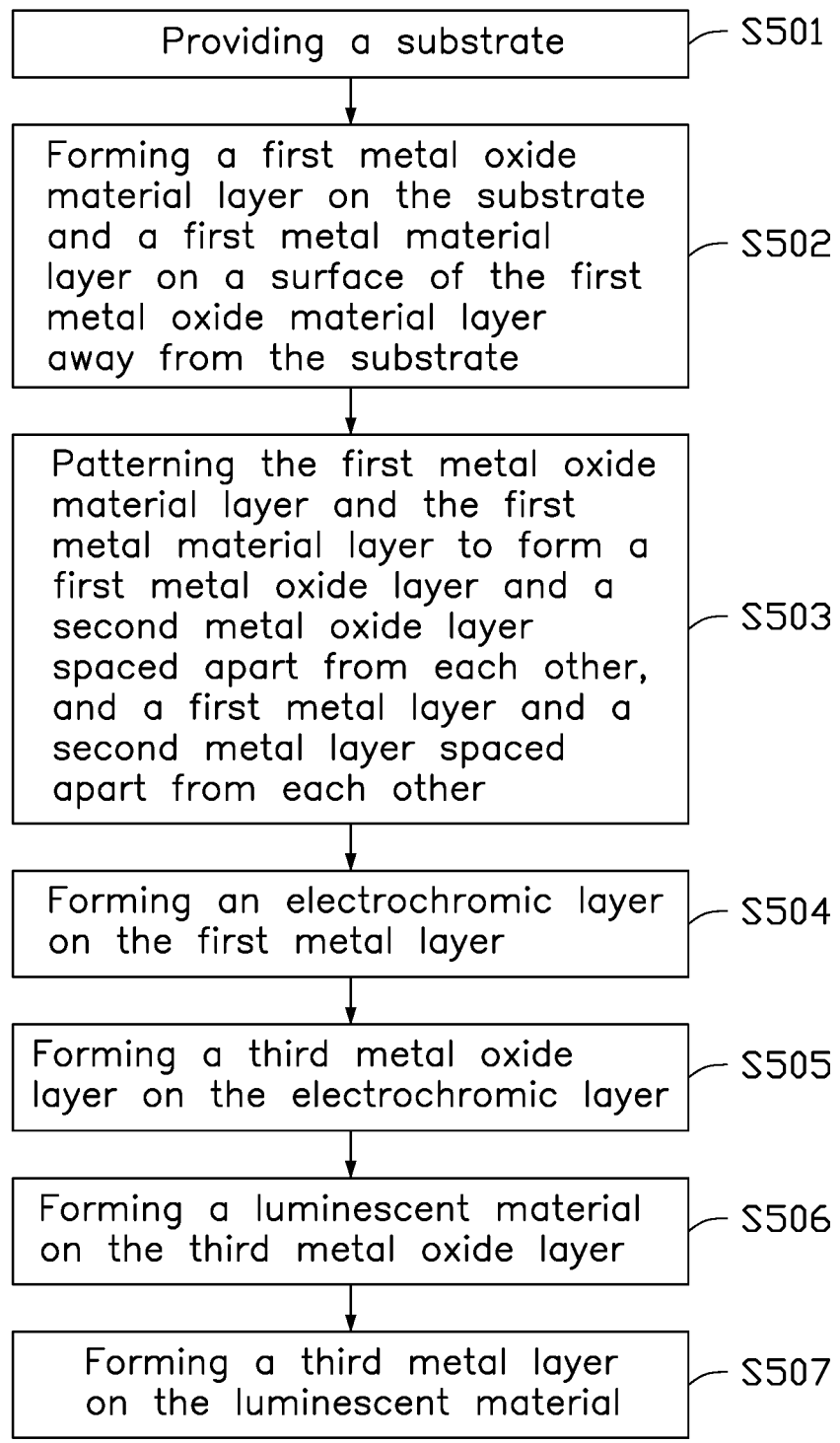
FIG. 5 is a flow chart of a method for making the OLED display panel of FIG. 1.

Referring to FIG. 5, a flowchart of a method in one embodiment is disclosed. The method is provided by way of embodiment, as there are a variety of ways to carry out the method. The method described below can be carried out using the configurations illustrated in FIGS. 7 through 13 for example, and various elements of these figures are referenced in explaining the method. Each block shown in FIG. 5 represents one or more processes, methods, or subroutines, carried out in the method. Additionally, the illustrated order of blocks is by example only and the order of the blocks can change. The method can begin at Block S501.

Figure 6:
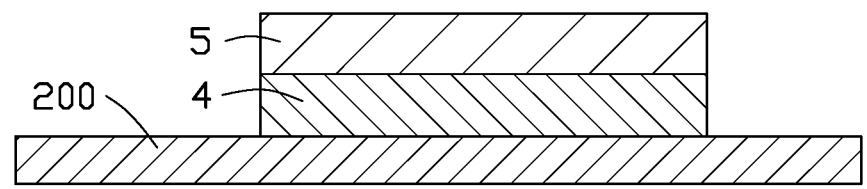
FIG. 6 is a schematic cross-sectional view of the substrate, the first metallic oxide material layer, and the first metal material layer during Block S502 of the method for making the OLED display panel as disclosed in FIG. 5.

Block S501: as shown in FIG. 6, a substrate 200 is provided.

In one embodiment, the substrate 200 is a TFT array substrate.

Block S502: as shown in FIG. 6, a first metallic oxide material layer 4 is formed on the substrate 200 and a first metal material layer 5 is formed on a surface of the first metallic oxide material layer 4 away from the substrate 200.

In one embodiment, the first metallic oxide material layer 4 can be better attached to the substrate 200 containing oxide, facilitating the fabrication of subsequent components.

Figure 7:
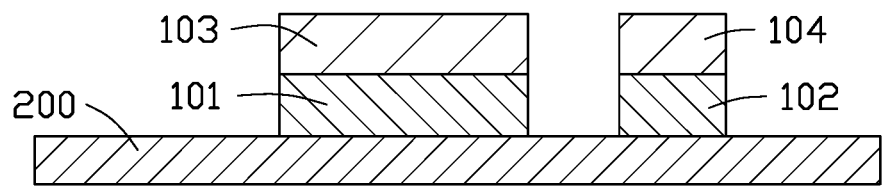
FIG. 7 is a schematic cross-sectional view of the first metallic oxide layer, the second metallic oxide layer, the first metal layer and the second metal layer during Block S503 of the method for making the OLED display panel as disclosed in FIG. 5.

Block S503: as shown in FIG. 7, the first metallic oxide material layer 4 are patterned to form a first metallic oxide layer 101 and a second metallic oxide layer 102 spaced apart from each other, and the first metal material layer 5 are patterned to form a first metal layer 103 and a second metal layer 104 spaced apart from each other.

In one embodiment, the first metallic oxide material layer 4 and the first metal material layer 5 may be patterned in the same photo-etching-process.

Figure 8:
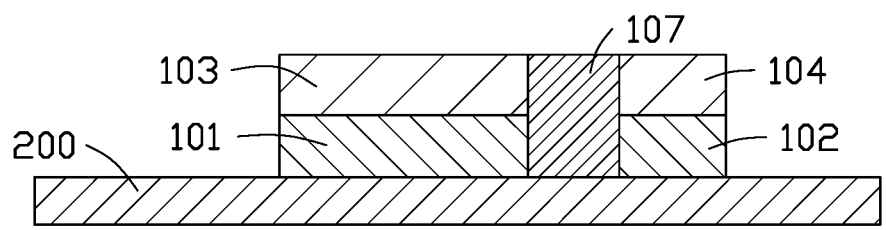
FIG. 8 is a schematic cross-sectional view of the first insulating layer during Block S503 of the method for making the OLED display panel as disclosed in FIG. 5.

As shown in FIG. 8, the first metallic oxide layer 101 and the second metallic oxide layer 102 and the first metal layer 103 and the second metal layer 104 are insulated and spaced apart by a first insulating layer 107. The first metal layer 103 and the second metal layer 104 are insulated and spaced apart from each other by the first insulating layer 107.

In one embodiment, the surface of the first insulating layer 107 away from the substrate 200 is flush with the surfaces of the first metal layer 103 and the second metal layer 104 away from the substrate 200, which is favorable for the fabrication of subsequent components.

Figure 9:
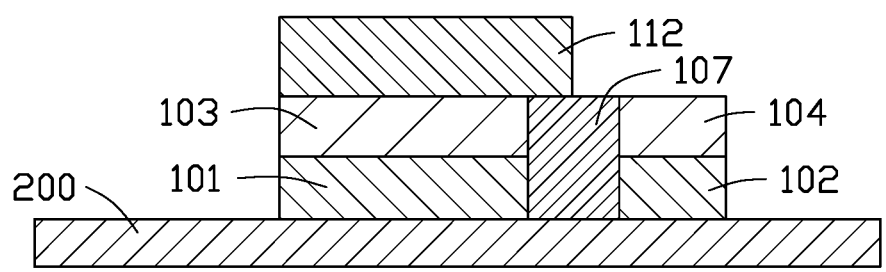
FIG. 9 is a schematic cross-sectional view of the electrochromic layer during Block S504 of the method for making the OLED display panel as disclosed in FIG. 5.

Block S504: as shown in FIG. 9, an electrochromic layer 112 is formed on the first metal layer 103 and the first insulating layer 107.

Figure 10:
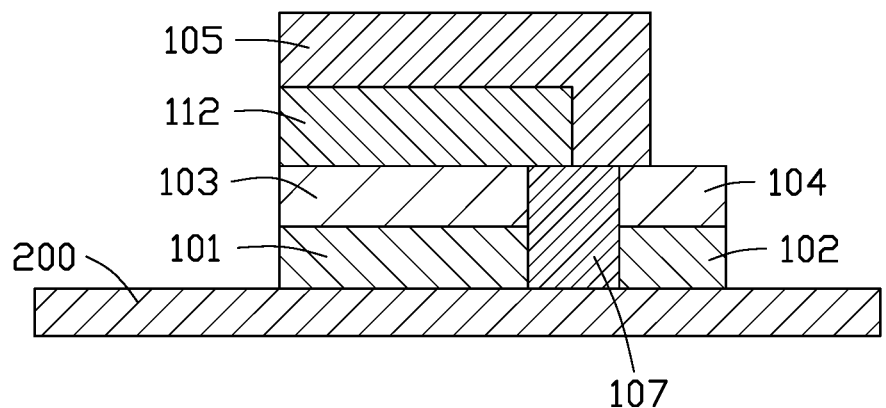
FIG. 10 is a schematic cross-sectional view of the metallic oxide layer during Block S505 of the method for making the OLED display panel as disclosed in FIG. 5.

Block S505: as shown in FIG. 10, a metallic oxide layer 105 is formed on the electrochromic layer 112, and the metallic oxide layer 105 extends from a surface of the electrochromic layer 112 away from the first metal layer 103 to the second metal layer 104 along a side surface of the electrochromic layer 112, so that the metallic oxide layer 105 is electrically connected with the second metal layer 104 and the second metallic oxide layer 102.

The first metallic oxide layer 101 and the first metal layer 103 serve as a first anode 111, and the metallic oxide layer 105, the second metal layer 104, and the second metallic oxide layer 102 as a first cathode 113. The first anode 111, the first cathode 113, and the electrochromic layer 112 form an electrochromic element 11. In one embodiment, the first cathode 113 further includes a second metal layer 104 and a second metallic oxide layer 102, wherein the second metal layer 104 can increase the conductivity of the first cathode 113.

Figure 11:
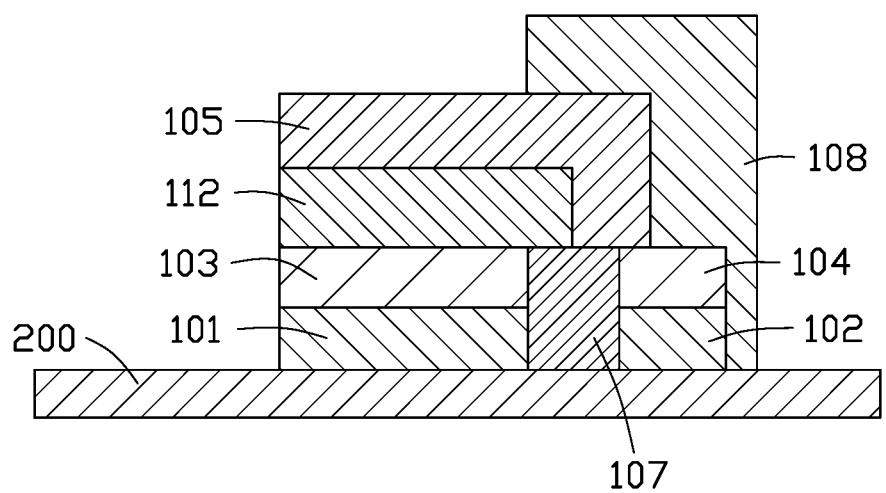
FIG. 11 is a schematic cross-sectional view of the second insulating layer during Block S505 of the method for making the OLED display panel as disclosed in FIG. 5.

As shown in FIG. 11, after forming the metallic oxide layer 105, a second insulating layer 108 partially covering a part of the metallic oxide layer 105 may be formed. The second insulating layer 108 also serves as a protective layer. In one embodiment, the second insulating layer 108 covers the metallic oxide layer 105, the second metal layer 104, and the second metallic oxide layer 102.

In one embodiment, before forming the metallic oxide layer 105, a fourth metal layer 109 may be formed on the electrochromic layer 112, and then the metallic oxide layer 105, the fourth metal layer 109 is in direct contact and electrically connected to the metallic oxide layer 105.

Figure 12:
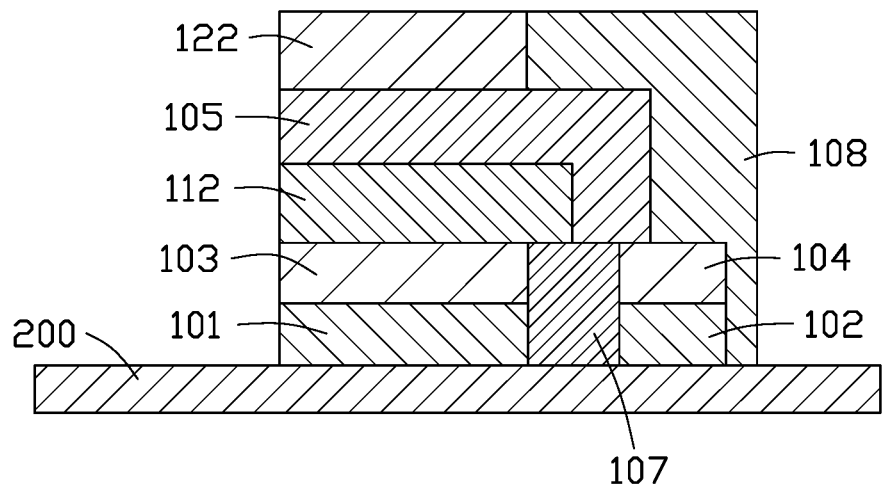
FIG. 12 is a schematic cross-sectional view of the light emitting material during Block S506 of the method for making the OLED display panel as disclosed in FIG. 5.

Block S506: as shown in FIG. 12, a light emitting material 122 is formed on the metallic oxide layer 105.

In one embodiment, the light emitting material 122 is formed on a part of the metallic oxide layer 105 not covered by the second insulating layer 108. The difference in segmentation between the light emitting material 122 and elements such as the metallic oxide layer 105 can be filled up by the second insulating layer 108. The surface of the second insulating layer 108 away from the substrate 200 is flush with the surface of the light emitting material 122 away from the substrate 200, which is beneficial to the fabrication of subsequent components.

Figure 13:
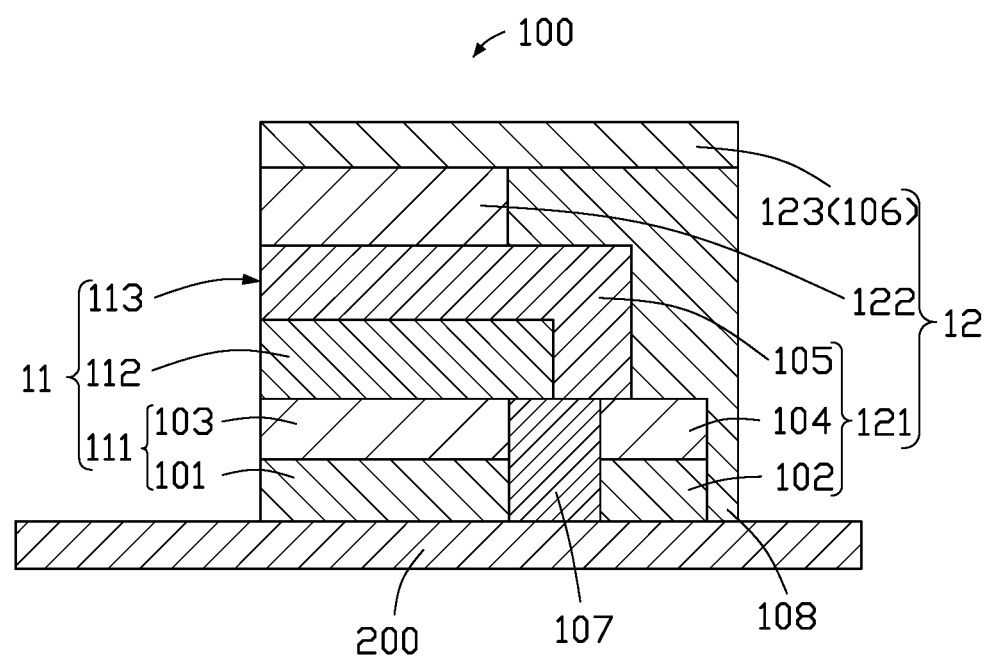
FIG. 13 is a schematic cross-sectional view of the third metal layer during Block S507 of the method for making the OLED display panel as disclosed in FIG. 5.

Block S507: as shown in FIG. 13, a third metal layer 106 is formed on the light emitting material 122.

In one embodiment, the metallic oxide layer 105, the second metal layer 104, and the second metallic oxide layer 102 serve as a second anode 121, the third metal layer 106 serves as a second cathode 123, and the second anode 121, the second cathode 123 and the light emitting material 122 form a light emitting element 12. In one embodiment, a portion of the second anode 121 of the light emitting element 12 is shared with the first cathode 113 of the electrochromic element 11. The electrochromic element 11 and the light emitting element 12 constitute a light emitting unit 100.

In one embodiment, the projection of the light emitting element 12 on the substrate 200 overlaps the projection of each of the electrochromic element 11, and the electrochromic layer 112 performs oxidation-reduction electrochemical reaction driven by the first anode 111 and the first cathode 113 to change its reflectivity and transparency, thereby realizing color compensation for the light emitting element 12. After compensation is applied by the electrochromic layer 112, the intensity of the light emitted from the light emitting element 12 toward the substrate 200 is increased, and it is reflected by the first metal layer 103 toward the direction away from the substrate 200. Therefore, while not affecting the display, the light emitting capacity of the light emitting element 12 can be reduced, to prolong the service life of the light emitting material 122 and reduce the energy consumption of the OLED display panel 1.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. An organic light emitting diode (OLED) display panel, comprising:
    a substrate;
    a plurality of light emitting units on the substrate;
    wherein each of the plurality of light emitting units comprises a light emitting element on the substrate and an electrochromic element on the substrate;
    the electrochromic element comprises a first cathode, a first anode, and an electrochromic layer between the first cathode and the first anode;
    the light emitting element comprises a second cathode, a second anode, and a light emitting material between the second cathode and the second anode; and
    a portion of the second anode is shared with the first cathode;
    wherein the first anode comprises a first metallic oxide layer on a surface of the substrate and a first metal layer between the first metallic oxide layer and the electrochromic layer;
    the second anode comprises a second metallic oxide layer on the surface of the substrate, a metallic oxide layer between the light emitting material and the electrochromic layer and a second metal layer between the second metallic oxide layer and the metallic oxide layer;
    the metallic oxide layer is shared with the first cathode.

2. The OLED display panel according to claim 1, wherein the electrochromic layer is configured to performs oxidation-reduction electrochemical reaction driven by the first anode and the first cathode, so as to realize color compensation of the light emitting unit;
    the first metal layer is configured to reflect light compensated by the electrochromic layer toward a direction away from the substrate.

3. The OLED display panel according to claim 1, further comprising a first insulating layer, wherein the first metallic oxide layer and the second metallic oxide layer are spaced apart from each other by the first insulating layer, the first metal layer and the second metal layer are spaced apart from each other by the first insulating layer, the first insulating layer fills a gap between the first metallic oxide layer and the second metallic oxide layer, a gap between the first metal layer and the second metal layer.

4. The OLED display panel according to claim 1, wherein a projection of the light emitting material on the substrate at least partially overlaps with a projection of each of the metallic oxide layer, the electrochromic layer, the first metal layer, and the first metallic oxide layer on the substrate.

5. The OLED display panel according to claim 4, wherein the projection of the light emitting material on the substrate completely overlaps with the projection of the electrochromic layer on the substrate and completely overlaps with the projection of the first metal layer on the substrate, and an area of the projection of the light emitting material on the substrate is larger than an area of the projection of the electrochromic layer on the substrate and an area of the projection of the first metal layer on the substrate.

6. The OLED display panel according to claim 1, further comprising a fourth metal layer between the electrochromic layer and the metallic oxide layer.

7. The OLED display panel according to claim 6, wherein a thickness of the fourth metal layer is less than a thickness of the first metal layer.

8. The OLED display panel according to claim 6, wherein the fourth metal layer is capable of transmitting light.

* * * * *